(12) United States Patent
Vashchenko et al.

(10) Patent No.: US 6,707,117 B1
(45) Date of Patent: Mar. 16, 2004

(54) METHOD OF PROVIDING SEMICONDUCTOR INTERCONNECTS USING SILICIDE EXCLUSION

(75) Inventors: Vladislav Vashchenko, Palo Alto, CA (US); Peter J. Hopper, San Jose, CA (US); Philipp Lindorfer, San Jose, CA (US); Andy Strachon, Santa Clara, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/285,235

(22) Filed: Oct. 31, 2002

(51) Int. Cl.$^7$ ................................. H01C 29/76
(52) U.S. Cl. ............ 257/384; 257/382; 257/383; 257/773; 257/757; 257/750; 257/754
(58) Field of Search ................. 257/773, 757, 257/750, 754, 384, 382, 383; 438/412, 413, 382, 383, 384, 387, 388, 903, 904, 643, 648, 649, 650, 655, 651, 680, 682, 683

(56) References Cited

U.S. PATENT DOCUMENTS

| 4,692,349 A | * | 9/1987 | Georgiou et al. ............ 437/230 |
| 4,793,896 A | * | 12/1988 | Douglas ...................... 156/643 |
| 2002/0132191 A1 | * | 9/2002 | Chuang ....................... 430/314 |

OTHER PUBLICATIONS

Syd R. Wilson, Clarence J. Tracy, and John L. Freeman, Jr., "Handbook of Multilevel Metallization for Integrated Circuits," Noyes Publ., Westwood, New Jersey (1993), pp. 42–44.*

* cited by examiner

Primary Examiner—Eddie Lee
Assistant Examiner—Thomas Magee
(74) Attorney, Agent, or Firm—Jurgen Vollrath

(57) ABSTRACT

In a semiconductor structure, interconnects between regions of a single device or different devices are achieved by forming metal plugs that span across the regions to be interconnected, wherein the plugs are formed from the metal used in forming a silicide layer on the structure. The metal is masked off in desired areas prior to etching, to leave the metal plugs.

3 Claims, 3 Drawing Sheets

METHOD OF PROVIDING SEMICONDUCTOR INTERCONNECTS USING SILICIDE EXCLUSION

FIELD OF THE INVENTION

The invention relates to the field of semiconductors. In particular, the invention relates to electrical interconnects and a method for providing electrical interconnects between regions in a semiconductor device.

BACKGROUND OF THE INVENTION

In the manufacture of semiconductor chips, cost is clearly an important concern. Ways are therefore always being looked for to reduce the size of devices in order to allow more devices to fit onto a semiconductor wafer. Also, speed considerations dictate strongly in favor of reduced size. Furthermore, cost is directly impacted by process considerations: especially the number of process steps involved in producing a particular circuit in semiconductor chip form.

Typically, semiconductor devices are built up in layers involving a series of process steps to produce the desired characteristics. For example, a typical semiconductor device such as the device 100 illustrated in FIG. 1, may include a polysilicon gate 110 insulated from the underlying silicon substrate by an oxide layer 112. Two n+ composite regions 114, 116 are shown and may comprise drain and source regions of a NMOS transistor. The device 100 is separated by shallow trench isolation regions 118, 120 from adjacent devices 130, 140, respectively. As mentioned above, the devices 100. 130, 140 are formed in layers. Typically, a silicon substrate is used in which the composite regions 114, 116 are formed by introducing impurities using one of several possible methods. The shallow trench isolation regions 118, 120 are formed as isolators between the devices. Thereafter a silicide layer 150 may be formed by depositing a layer of metallic material such as cobalt or titanium and annealing it to react with the silicon to form a silicide. Thereafter the excess, unreacted cobalt or titanium is removed using an etch process. This is followed by depositing a thick oxide layer (TEOS) 152. In order to provide electrical contacts to specific regions in the device, holes are etched into the TEOS 152 using masking and etching steps, whereafter the holes are filled with metal such as tungsten to define tungsten contacts or plugs 160, 162. A metal layer (metal 1) 170 is then formed on top of the TEOS 152 to contact the contacts 160, 162. In order, for example, to interconnect the polysilicon gate 110 and the composite material 180 of adjacent device 140, contacts 182, 184 are provided to the polysilicon gate 110 and composite 180, respectively, as shown in the plan view of FIG. 2. The metal 1 layer 170 is formed to provide a metal interconnect between the contact 182 and contact 184.

It will be appreciated that the formation of the interconnect between the polysilicon gate 110 and composite 180 involves quite a number of steps and is space consuming due to the need to build the vertical contacts 182, 184 and the array of metal traces of the metal 1 layer 170. The present invention seeks to provide a simpler, more cost effective, and more compact solution for interconnecting regions in a semiconductor device.

SUMMARY OF THE INVENTION

The present invention provides for electrically interconnecting regions in a semiconductor structure, either within a device or between devices by forming metal plugs from the metal used during the formation of the metal silicide layer.

According to the invention, there is provided a method of providing an interconnect between a first region and a second region of a semiconductor device, comprising as part of the process of forming a metal silicide layer, masking off a region that spans across the regions to be interconnected to leave behind, during the etching of the metal used for the silicide layer, a metal interconnect over said regions. Typically the forming of the metal silicide layer includes depositing a metal layer, annealing the metal to form a silicide layer, and etching the unsilicided metal. The method preferably includes providing a mask to selectively etch the unsilicided metal so as to leave behind unsilicided metal over selected areas to be interconnected. The metal may, for example, be cobalt.

Further, according to the invention, there is provided a method of forming an interconnect between two regions in a semiconductor structure, comprising depositing a metal over at least part of the structure, annealing the metal to form a silicide layer, masking off at least one desired portion of the metal, and etching the metal to leave at least part of the silicide layer and the metal over said at least one desired portion, wherein at least one of said at least one desired portions spans across two or more regions of the semiconductor structure. The two or more regions spanned by at least one of the desired portions may be two composite regions or a composite region and a polysilicon region of the same or different devices. For example the regions may be a polysilicon gate of one device, and a n+ or p+ composite region of a different device on the structure. The metal material may be cobalt.

Still further, according to the invention, there is provided a CMOS structure that includes a polysilicon gate, a composite region, and a silicide layer, wherein the polysilicon gate is connected to the composite region by means of a single metal plug contacting the gate polysilicon and composite region, the metal plug being made of the same metal as the metal of the silicide layer. The metal plug may be a cobalt plug. The polysilicon gate and composite region may form part of the same device or different devices.

Still further, according to the invention, there is provided a semiconductor structure that includes at least two composite regions, and a silicide layer, wherein at least two of the composite regions are interconnected by means of a single metal plug contacting the at least two composite regions, the metal plug being made of the same metal as the metal of the silicide layer. The metal plug may be a cobalt plug. The composite regions may form part of the same device or different devices.

Still further, according to the invention, there is provide a semiconductor device comprising a polysilicon gate, a n+ composite defining a source region, a n+ composite defining a drain region, a plurality of polysilicon drain regions extending between a drain contact and the drain region, and a silicide layer, wherein at least one of the polysilicon drain regions is connected to the n+ drain composite by a metal plug made of the same material as the metal of the silicide layer. More than one polysilicon drain region may be connected to the n+ drain composite by means of one or more of said metal plugs. The metal plugs may be cobalt plugs.

DETAILED DESCRIPTION OF THE INVENTION

Figure 1:
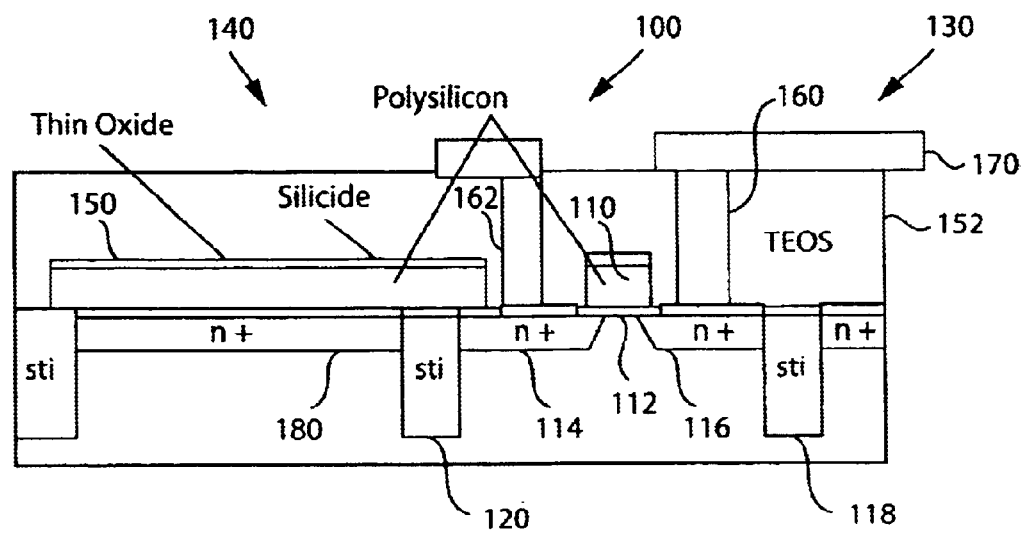
FIG. 1 is a sectional view through a prior art semiconductor structure.
Figure 2:
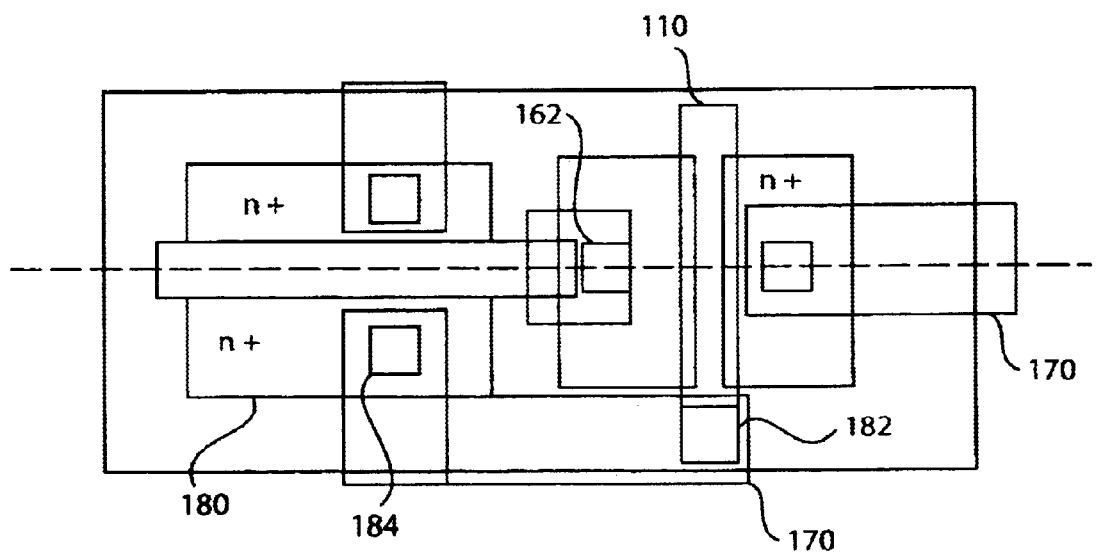
FIG. 2 is a partially transparent plan view not to scale of the FIG. 1 structure.
Figure 3:
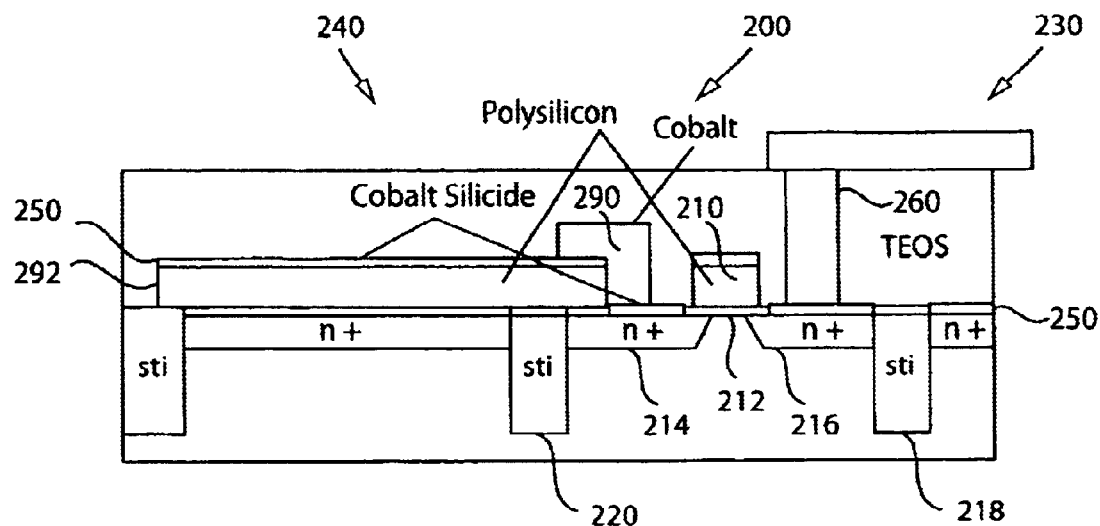
FIG. 3 is a sectional view through one embodiment of a semiconductor structure of the invention.
Figure 4:
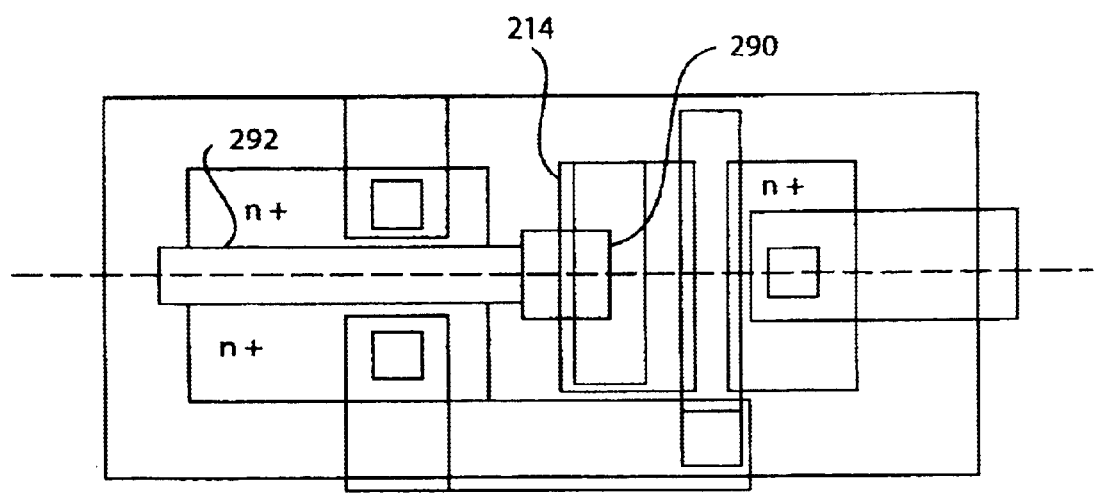
FIG. 4 is a partially transparent plan view not to scale of the FIG. 3 structure.

One embodiment of a semiconductor structure making use of an interconnect in accordance with the invention is shown in FIGS. 3 and 4. Much of the structure is the same as in the prior art structure of FIGS. 1 and 2. For instance, the structure of the embodiment of FIGS. 3 and 4 includes a device 200 having a polysilicon gate 210 insulated from the underlying silicon substrate by an oxide layer 212. Two n+ composite regions 214, 216 are shown and could, for instance, comprise drain and source regions of a NMOS transistor. The device 200 is separated by shallow trench isolation regions 218, 220 from adjacent devices 230, 240, respectively. In accordance with typical process steps, the devices 200, 230, 240 are formed in layers. Initially, a silicon substrate is used in which the composite regions 214, 216 are formed by introducing impurities using one of several possible methods. The shallow trench-isolation regions 218, 220 are formed as isolators between the devices 200 and 230, and between 200 and 240. Thereafter a silicide layer 250 is formed by depositing a layer of metallic material such as cobalt or titanium and annealing it to react with the silicon to form a silicide.

In accordance with the present invention, the excess, unreacted cobalt or titanium is not removed in its entirety. Instead some of the unreacted metal used to form the silicide layer 250, is selectively retained by masking off certain regions prior to embarking on the etch process that leaves behind the silicide layer 250. In this case plug 290 spans the polysilicon region 292 of device 240, and composite region 214 of device 200. In this way it forms an interconnect between the polysilicon region of device 240 and the composite region of device 200, using a single metal plug 290. As is evident from FIGS. 3 and 4, the plug 290 contacts the n+ composite 214 via the silicide layer 250.

Thus, in accordance with the invention, defined areas covering any two or more regions that are to be interconnected (e.g., a composite region and a polysilicon region, or two composite regions, whether they are of the same device or different devices) are masked to leave a metal plug that interconnects the regions. In the embodiment of FIGS. 3 and 4, the metal used to form the metal silicide, is cobalt which, when annealed, reacts with silicon to form the cobalt silicide layer 250.

The rest of the structure of FIGS. 3 and 4 follows typical process steps. In this case, it includes depositing a thick oxide layer (TEOS) 252. In order to provide electrical contacts to specific regions in the device, a prior art approach could be used in which, after chemical mechanical polishing (CMP) of the TEOS 252, holes are etched into the TEOS 252 using masking and etching steps, whereafter the holes are filled with metal such as tungsten to define tungsten contacts or plugs as shown for the plugs 260, 282, 284. A metal layer (metal 1) 270 is then formed on top of the TEOS 252 to contact the contacts, such as contacts 260, 282, 284.

While the present embodiment specifically showed the interconnection between a polysilicon region of one device and a composite region of another device, it will be appreciated that this was shown by way of example only and that other embodiments and implementations of the invention are possible. For instance, interconnects in accordance with the invention can also be made between regions on a single device. Also, interconnects in accordance with the invention can be made between two composite regions on the same device or different devices. Also, while the embodiment illustrated in FIGS. 3 and 4 showed a CMOS device, the invention could also be used to provide interconnects between regions of other devices, e.g., BJT devices.

Figure 5:
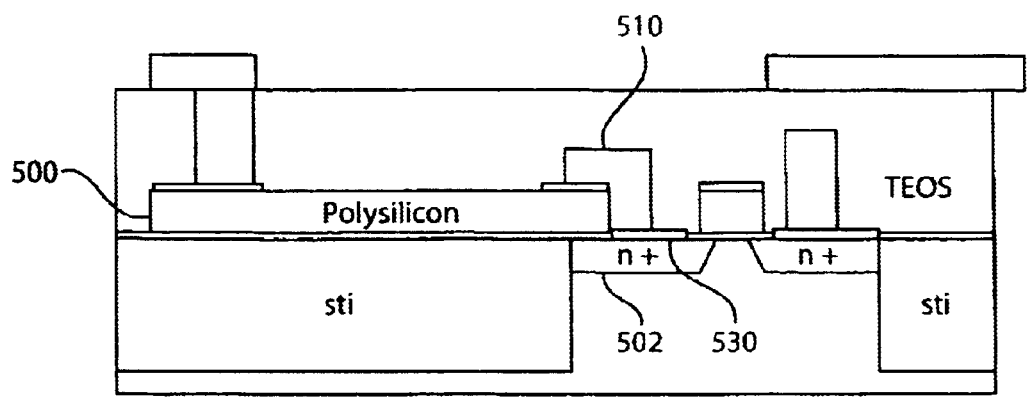
FIG. 5 is a sectional view through another embodiment of a semiconductor structure of the invention.
Figure 6:
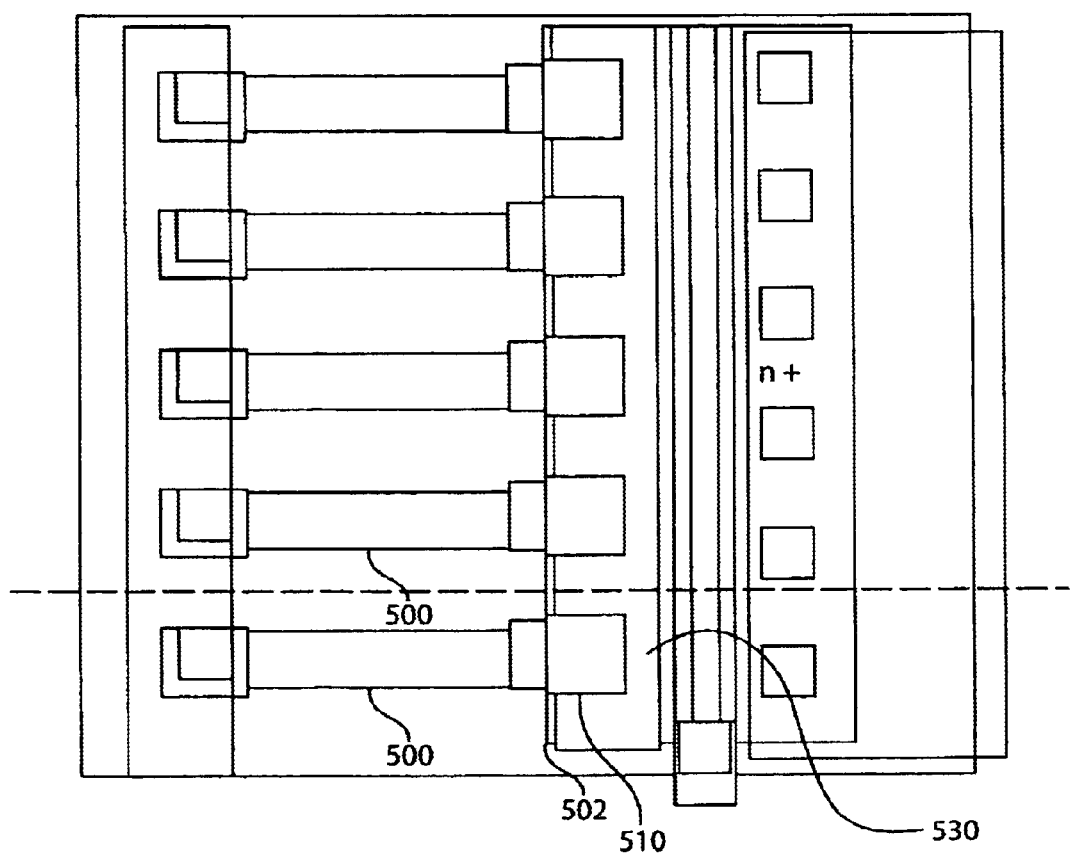
FIG. 6 is a partially transparent plan view not to scale of the FIG. 5 structure.

Another implementation of the invention is shown in FIGS. 5 and 6. This embodiment shows an ESD protection device having a low capacitance ballasing region as proposed in an ESD/EOS Symposium 2001 paper (pages 1–11) entitled "Multi-finger Turn-on Circuits and Design Techniques for Enhanced ESD Performance and Width-scaling" by Sarnoff Corporation. The present invention can be implemented in a Sarnoff-like structure as shown in FIGS. 5 and 6, in which the polysilicon fingers 500 are connected to the n+ composite region 502 by means of plugs or contacts 510 in accordance with the invention. As can be seen, once again, the contact to between the plugs 510 and n+ composite region 502 is not directly with the composite region 502, but via the silicide layer 530.

The present invention thus provides a simpler, more cost effective, and more compact solution for interconnecting regions in a semiconductor device, by sharing a plug between two regions, and forming the plug using an existing layer of metal used in the silicide process.

It will be appreciated that, while the invention was described above with respect to specific embodiments, the claimed invention can be realized using other configurations, without departing from the scope of the invention. For instance, while the embodiments discussed above involve CMOS devices, the invention is applicable to other semiconductor devices such as BJTs as well.

What is claimed is:

1. A semiconductor device, comprising
   a polysilicon gate,
   a n+ composite defining a source region
   a n+ composite defining a drain region
   a plurality of polysilicon drain regions extending between a drain contact and the drain region, and
   a silicide layer, wherein at least one of the polysilicon drain regions is connected to the n+ drain composite by a metal plug made of the same material as the metal of the silicide layer.

2. A semiconductor device of claim 1, wherein more than one polysilicon drain region is connected to the n+ drain composite by means of one or more of said metal plugs.

3. A semiconductor device of claim 2, wherein the metal plugs are cobalt plugs.

* * * * *